United States Patent
Foulard et al.

(10) Patent No.: US 12,044,598 B2
(45) Date of Patent: Jul. 23, 2024

(54) METHOD FOR DETERMINING A LOAD PREDICTION FOR A COMPONENT OF A VEHICLE

(71) Applicant: Compredict GmbH, Darmstadt (DE)

(72) Inventors: Stéphane Foulard, Rödermark (DE); Rafael Fietzek, Darmstadt (DE); Ousama Esbel, Darmstadt (DE)

(73) Assignee: Compredict GmbH, Darmstadt (DE)

( * ) Notice: Subject to any disclaimer, the term of this patent is extended or adjusted under 35 U.S.C. 154(b) by 459 days.

(21) Appl. No.: 17/602,761

(22) PCT Filed: Apr. 9, 2020

(86) PCT No.: PCT/EP2020/060246
§ 371 (c)(1),
(2) Date: Oct. 10, 2021

(87) PCT Pub. No.: WO2020/208182
PCT Pub. Date: Oct. 15, 2020

(65) Prior Publication Data
US 2022/0178789 A1    Jun. 9, 2022

(30) Foreign Application Priority Data
Apr. 12, 2019    (LU) ........................................ 101181

(51) Int. Cl.
*G01M 17/007*    (2006.01)
*G06F 30/27*    (2020.01)

(52) U.S. Cl.
CPC ........... *G01M 17/007* (2013.01); *G06F 30/27* (2020.01)

(58) Field of Classification Search
CPC ............................. G01M 17/007; G06F 30/27
(Continued)

(56) References Cited

U.S. PATENT DOCUMENTS 6,550,320 B1 *    4/2003    Giustino ............... B60T 8/1725
73/146
9,395,707 B2 *    7/2016    Anderson .......... G05B 23/0283
(Continued)

FOREIGN PATENT DOCUMENTS

CN    103282233 A    9/2013
CN    108830414 A    11/2018
(Continued)

OTHER PUBLICATIONS

Hyland, Stephanie et al., "Real-Valued Medical Time Series Generation with Recurrent Conditional GANs", Dec. 4, 2017, arXiv:1706.02633 (Year: 2017).*

*Primary Examiner* — Tuan C To
*Assistant Examiner* — Dominick Mulder
(74) *Attorney, Agent, or Firm* — Smartpat PLC

(57) ABSTRACT

A load prediction method for a component of a vehicle includes a model creation process. A load model is created using an identification method based on a training-drive data group, a training vehicle data group and a training load group. The training-drive data group contains training-drive data sets, each containing route data and/or accompanying drive data for a training drive of a training vehicle on a training route. The training vehicle data group comprises vehicle data from the training vehicle used on the training drive. The training load group includes training load data including a load of the component that corresponds to a training-drive data set. The load model approximates the occurring load on a predetermined training route or with predetermined accompanying drive data or according to predetermined vehicle data. In a model evaluation process, the load prediction is determined using the load model.

12 Claims, 2 Drawing Sheets

(58) Field of Classification Search
USPC .......................................................... 701/1
See application file for complete search history.

(56) References Cited

U.S. PATENT DOCUMENTS

| | | | | |
|---|---|---|---|---|
| 10,821,983 | B1* | 11/2020 | Koebler | B60K 35/00 |
| 2007/0261499 | A1* | 11/2007 | Hamilton | G01M 17/007 |
| | | | | 73/865.6 |
| 2008/0114506 | A1* | 5/2008 | Davis | G05B 13/0265 |
| | | | | 701/16 |
| 2012/0197500 | A1* | 8/2012 | Sujan | B60W 10/11 |
| | | | | 701/1 |
| 2013/0338875 | A1 | 12/2013 | Weiss et al. | |
| 2015/0266455 | A1 | 9/2015 | Wilson | |
| 2015/0338313 | A1 | 11/2015 | Tanaka et al. | |
| 2016/0025025 | A1* | 1/2016 | Schöggl | G07C 5/00 |
| | | | | 701/29.1 |
| 2016/0055419 | A1* | 2/2016 | Fischer | G06N 5/048 |
| | | | | 706/12 |
| 2017/0017736 | A1* | 1/2017 | Beale | G06F 30/20 |
| 2017/0212974 | A1* | 7/2017 | Khapane | G06F 30/15 |
| 2017/0309092 | A1* | 10/2017 | Rosenbaum | G07C 5/0808 |
| 2017/0336289 | A1* | 11/2017 | Pfister | G01M 17/0072 |
| 2018/0275044 | A1* | 9/2018 | Surana | G01N 19/08 |
| 2018/0339710 | A1 | 11/2018 | Hashimoto | |
| 2018/0341743 | A1 | 11/2018 | Foulard et al. | |
| 2019/0265128 | A1 | 8/2019 | Rinderknecht et al. | |
| 2019/0308624 | A1* | 10/2019 | Borhan | B60W 30/165 |
| 2020/0125472 | A1* | 4/2020 | Arechiga Gonzalez | G01M 17/007 |
| 2020/0310479 | A1* | 10/2020 | Worth | G05F 1/66 |
| 2021/0365602 | A1* | 11/2021 | Gifford | G06T 17/00 |
| 2021/0380110 | A1* | 12/2021 | Grasreiner | G01M 17/0074 |

FOREIGN PATENT DOCUMENTS

| | | |
|---|---|---|
| DE | 102017007136 A1 | 1/2019 |
| EP | 2947448 A1 | 11/2015 |
| WO | 2018178196 A1 | 10/2018 |

* cited by examiner

METHOD FOR DETERMINING A LOAD PREDICTION FOR A COMPONENT OF A VEHICLE

TECHNICAL FIELD

The invention relates to a method for determining a load prediction for a component of a vehicle.

BACKGROUND

When designing vehicle components, a load to be expected over a predetermined service life is usually identified for each vehicle component and the relevant component is designed taking into account this load. It is known from the prior art to identify the load to be expected on the basis of training drives using vehicles of one vehicle type, with the vehicle type corresponding to the types for which the new component is intended to be designed. In addition, it is known from WO 2018/178 196 A1 to identify the information required for identifying the load during operation of an entire vehicle fleet. In particular with such an approach, for identifying the load, large numbers of different courses of the routes having various road properties and weather conditions as well as different driver properties are identified and are taken into account when determining the load to be expected.

As a rule, the methods known from the prior art are suitable for determining a specific load for a certain component, provided that all the model input variables are predetermined. In order for it to be possible to simulate different loads, it is necessary, for example, to predetermine a plurality of speed profiles for a predetermined route and to determine corresponding loads on this basis using the known load models.

In order to design vehicle parts, it is desirable to identify the load of the component over a typical course of a journey. However, in reality, even if they are conducted by a professional driver on the same training track, training drives on the basis of which the load models are created differ slightly from one another and result in different courses of loading and, accordingly, different loads. In this case, the load and the course of loading are subject to a probability of distribution, which describes the probability of a certain load state on the basis of the training vehicle used and the course of the route of the training route. Influences of this kind are not taken into account in the methods known from the prior art for the simulation of loads and courses of loading.

The load is the total load, e.g. a load spectrum, which has acted on the component during the drive, whereas the course of loading is a time series of individual load values that have acted on the component during the drive. The load can be determined from the course of loading.

Within the meaning of the following description of the invention, data used for training the load model are denoted by the prefix "training". Data generated by the load model have the prefix "prediction".

SUMMARY

The present disclosure further develops methods known from the prior art for identifying a course of loading and/or a load.

The disclosure provides a method for determining a load prediction for a component of a vehicle, wherein, in a model creation process, a load model is created using an identification method on the basis of a training-drive data group, a training vehicle data group and a training load group, wherein the training-drive data group contains a large number of training-drive data sets, each containing certain course of the route data and/or accompanying drive data for a training drive of a training vehicle on a training route, wherein the training vehicle data group comprises vehicle data from the training vehicle used on the relevant training drive, wherein the training load group includes training load data, wherein the training load data include a load of the component that corresponds to a training-drive data set, is detected using measurement technology or is calculated on the basis of measurement variables, wherein the load model approximates a probability distribution of the occurring load on a predetermined training route and/or with predetermined accompanying drive data and/or according to predetermined vehicle data such that the load model is a model of the probability distribution, and wherein, in a model evaluation process, the load prediction was determined using the load model for a predetermined prediction route and/or for predetermined accompanying prediction drive data and/or according to predetermined prediction vehicle data from a prediction vehicle. Advantageously, in the model evaluation process, a large number of simulations of the load model are conducted for a prediction vehicle. In this way, the widely spread range of user conditions can be covered in an improved manner, such that an improved picture of the minimum and maximum loads that are likely to occur can ultimately be obtained.

The modelling of the probability distribution amounts to generating non-deterministic or statistical models on the basis of training data, which are capable of extrapolation with regard to new parameter combinations or sets and/or vehicle configurations or are capable of extrapolation with regard to new driving routes, with there not being any comparative measurements in either of the cases described. In this case, the concept of probability distribution of the starting variables plays an essential role, because the trained model reproduces the probability of a certain load occurring (e.g. the probability that an actual load takes a certain value at a certain point in time owing to a current state). Specifically, this means that, when simulating a load model of this kind, each new simulation of the trained model gives a different result. For example, when the object is to simulate a time series, each simulation based on the same parameter would provide different time series, which, although they deviate from one another, remain within a realistic context owing to the probability distribution (e.g. each model evaluation process, i.e. each simulation run of a trained model, generates a different result or an individual time series, even if the parameter input remains the same). A real example of such behaviour in a real system is that of conducting tests for entire vehicles with driving guidelines: here, measurement drives differ from one another, since a large number of influencing variables cannot be influenced, even if the test drivers try to perform the driving manoeuvre in as reproducible a manner as possible. This results in a common/usual and unavoidable spread. The approach according to the disclosure addresses exactly this problem by this spread being specifically modelled and then also simulated. This is a major difference from established modelling approaches, which generate static or deterministic models.

When such a non-deterministic or statistical model has been generated, a high number of simulations can thus be conducted with the same parameters (e.g. 10,000 simulations) in order to reproduce the complete spread with a good level of granularity, with each simulation giving a different result and all the results reproducing the modelled probability distribution when taken together. In this way, the bandwidth of the possible system responses can be covered and more realistic results and simulations can be generated.

The load model therefore does not constitute a model which deterministically reproduces reality "as well as possible", as in standard modelling approaches, but instead is an AI-based, data-driven model, which learns the spread of the load due to non-detectable influencing variables and reproduces reality with these non-detectable uncertainties.

This approach also cannot be compared with control engineering approaches which, although they can also take uncertainties into account, can only operate with feedback loop to the real system. In the approach according to the disclosure, pure simulation models are exclusively used, which learn from real systems in order to be able to reproduce previously non-existent systems. Controlled systems are not capable of making this prediction.

In addition, model accuracy and probability distribution must not be confused. The model accuracy is the deviation between a model which provides the same result in each simulation with the same parameters and input variables and one or more measurements. An evaluation of the probability distribution is, however, only possible when the model, such as the load model, provides different results with the same parameters and input variables. Since real measurements can never be reproduced 100% and always exhibit deviations, the method described provides a more comprehensive and realistic reproduction of reality. Therefore, by means of the method, the accuracy of the load prediction can be increased by covering the possible uncertainties on the basis of the modelling of the probability distribution.

It is advantageously provided that the load prediction is a course of loading prediction, the training load group including training-load time series, the training-load time series each including a course of loading of the component that corresponds to a training-drive data set, is detected using measurement technology or is calculated on the basis of measurement variables, the load model approximating the probability distribution of the occurring course of loading, and the course of loading prediction being determined in the model evaluation process. In the model evaluation process, a large number of prediction load time series are advantageously identified, with the individual load states calculated in the prediction load time series in each case again following the probability distribution. In this way, the slightly differentiated course of loadings can for example be simulated in training drives by a training driver using a predetermined training vehicle on a certain training route. The identified course of loadings are each time series. Since a model of the probability distribution of the course of loading, namely the load model, is used for the simulation, the simulated course of loading predictions differ from one another, despite the same input variables, namely the prediction route and/or the accompanying prediction drive data and/or the prediction vehicle data of a prediction vehicle, being used for the simulation in each case.

The training drives are advantageously conducted as planned test drives. It is, however, also possible and provided that the training drives are normal drives on roads by any vehicles, with the data required for the modelling being detected in the vehicles and for example being wirelessly transmitted to a central server.

Advantageously, it is provided that the training-drive data sets are training-drive time series. The various training-drive time series may constitute time-series segments of a single training drive.

The training-drive data sets may be predetermined or detected using measurement technology. For example, it is thus possible for the course of the route to be identified and predetermined from an available map of the training route or for the course of the route to be identified during the training drive, for example by GPS.

The load model may be determined on the basis of a probabilistic model structure. Various model structures that allow for the approximation of probability distributions are known from the prior art.

Advantageously, it is provided that the load model is determined on the basis of a generative model structure. In this way, the calculation complexity for creating the load model can be considerably reduced. Fully visible Bayesian networks or a vectored model, such as a variational autoencoder, are advantageously used as the model structure. In a particularly advantageous configuration of the method, it is provided that a recurrent conditional generative adversarial network is used as the model structure for the load model. The use of these model structures for probabilistic models is known to a person skilled in the art and is described in Ian Goodfellow, Yoshua Bengio, Aaron Courville: Deep Learning, mitp Verlag Frechen, ISBN: 9783958457003, for example.

In order to check model accuracy of the identified load model, it is provided that the model evaluation process is first conducted multiple times, i.e. 10,000 times, for example, using a predetermined prediction route and/or for predetermined accompanying prediction drive data and/or on the basis of predetermined prediction vehicle data from a prediction vehicle. A conventional deterministic model is then determined on the basis of the simulated load predictions, for example using a neural-network approach. The accuracy of this deterministic model can then be validated against real drive and load data, as is known from conventional deterministic modelling. To do this, the least mean squares error between the simulation and the real measured data is often used. Provided that an appropriate level of accuracy can be achieved thereby, it can be assumed therefrom that the probability distribution of the entirety of the simulated load predictions corresponds to the real probability distribution of the load and the model quality of the load model is sufficient.

The method can be used to identify realistic loads and course of loadings under predetermined conditions, i.e. for a course of the route and a vehicle type. In this way, the probability distribution, which can be attributed to the driving behaviour of the training driver or drivers, can be reproduced, for example.

It is, however, possible and provided that different training-drive data sets contain course of the route data and accompanying drive data which have been conducted under differing training conditions. Therefore, it is advantageously possible to conduct training drives with different training vehicles of the same vehicle type on a training route in order to determine a probability distribution for the course of loading that has been influenced by manufacturing variations or other influences, for example.

It is provided that the different training conditions involve the training drives having been conducted using at least two different training vehicles and/or having been conducted on at least two different training routes and/or under at least two different environmental conditions. It is also possible and provided that different experimental parameters are varied in order to identify a generally valid model for the probability distribution under different conditions.

The vehicle data advantageously contain a vehicle mass, a drag coefficient, and a tyre diameter of the training vehicle. As a rule, the vehicle data are predetermined parameters of the training vehicle. The vehicle data are, however, not parameters that change during operation of the vehicle, such as a vehicle speed.

Advantageously, it is provided that the training vehicles are of a different vehicle type than the prediction vehicle. In this way, by means of the load model, different course of loadings can be identified for different vehicle types which follow a realistic load distribution.

In order to take load dynamics into account in the load model, it is also provided that dynamics of a component load over the driven or predetermined course of the route is taken into account in the load model.

Other advantageous configurations of the method are explained in greater detail with reference to an embodiment shown in the drawings.

DETAILED DESCRIPTION

Figure 1:
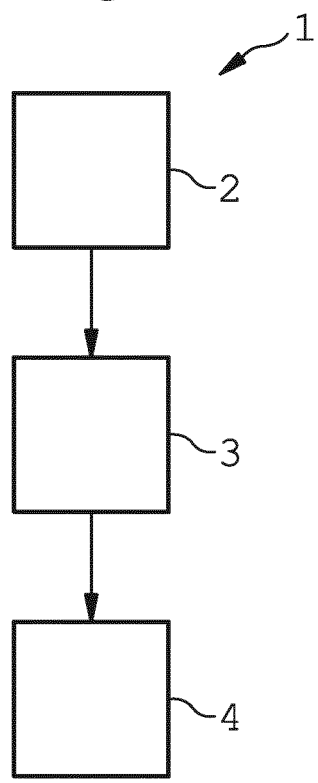
FIG. 1 is a schematic flow diagram of the method.

In the method 1 shown schematically in FIG. 1, in a test process 2, a large number of training drives were conducted by a single training driver or by different training drivers using one training vehicle or different training vehicles on a single training route or on different training routes and the load time series occurring during the various training drives were identified. In addition, course of the route data were determined for each training drive.

On the basis of the load time series group and the training-drive data group formed by these time series data as well as of the training vehicle data group including vehicle data from the training vehicle or the training vehicles, a load model approximating probability distributions of the course of loadings is determined in a model creation process 3. On the basis of this model, a large number of loads can then be determined in a model evaluation process 4 and can be used for a simulation of a load of a certain component of a vehicle that is still in development, for example. In this case, the identified course of loadings in turn follow the probability distributions, approximated by the model, of the training data identified during the training drives.

Figure 2:
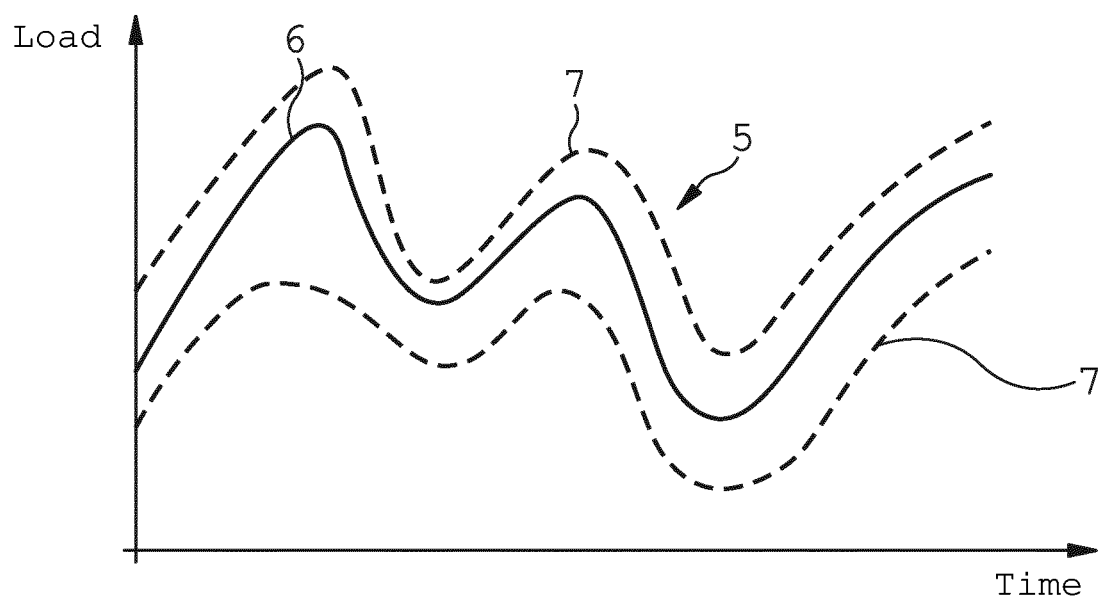
FIG. 2 is a schematic view of a load group consisting of load time series and
FIG. 3 is a schematic view of a load group plotted against cumulative load cycles.

FIG. 2 schematically shows a load group 5. The load group 5 consists of a large number of load time series, which follow a probability distribution. This figure schematically shows the most probable course of loading 6 and spread boundaries 7.

Figure 3:
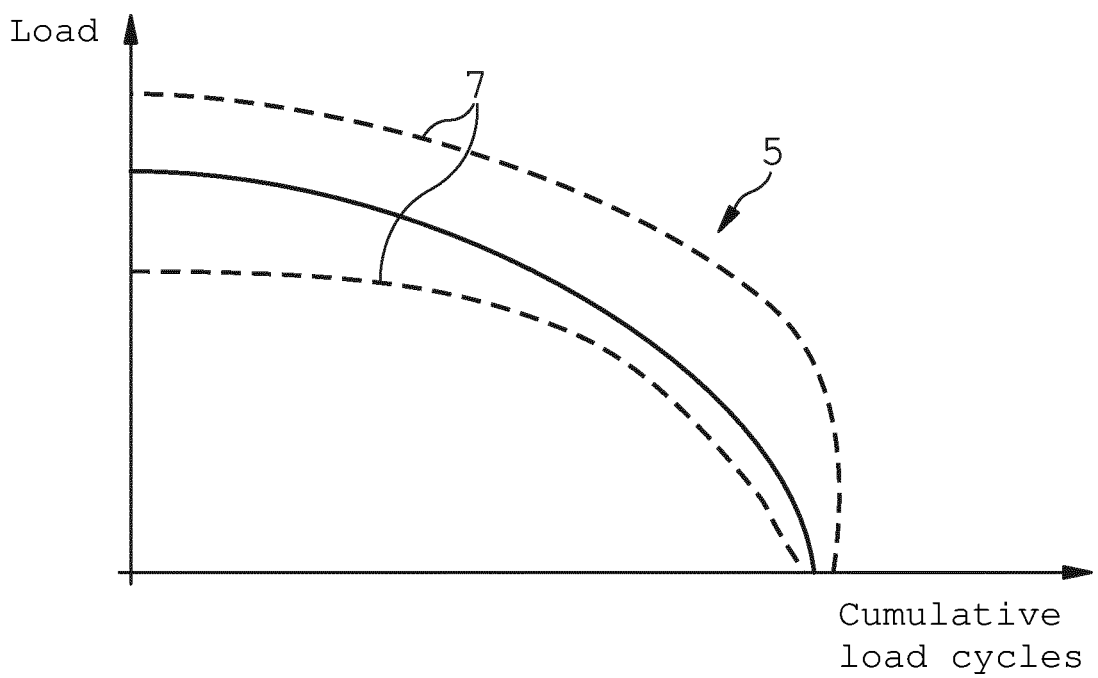

FIG. 3 schematically shows a load group 5. In this figure, loads are plotted against cumulative load cycles. In this figure, larger loads occur more rarely than small loads. In addition, the spread of the shape of larger loads, as denoted by the spread boundaries 7, is greater than that of the small loads.

The invention claimed is:

1. A method (1) for determining a load prediction for a component of a vehicle, comprising:
obtaining a plurality of training-drive data sets, each containing certain course of route data and/or accompanying drive data during a training drive of a training vehicle on a training route;
creating, in a model creation process (3), a load model using an identification method based on a training-drive data group, a training vehicle data group, and a training load group,
wherein the training-drive data group contains the plurality of training-drive data sets,
wherein the training vehicle data group comprises vehicle data from the training vehicle used on the relevant training drive,
wherein the training load group includes training load data,
wherein the training load data include a load of the component that corresponds to a training-drive data set, is detected using measurement technology or is calculated based on measurement variables,
wherein the load model approximates a probability distribution of the occurring load on a predetermined training route and/or with predetermined accompanying drive data and/or according to predetermined vehicle data such that the load model is a model of the probability distribution; and
determining, in a model evaluation process (4), the load prediction using the load model for a predetermined prediction route and/or for predetermined accompanying prediction drive data and/or according to predetermined prediction vehicle data from a prediction vehicle.

2. The method (1) according to claim 1,
wherein the load prediction is a course of loading prediction,
wherein the training load group includes training-load time series,
wherein the training-load time series each includes a course of loading (6) of the component that corresponds to a training-drive data set, is detected using measurement technology or is calculated based on measurement variables,
wherein the load model approximates the probability distribution of the occurring course of loading (6), and
wherein the course of loading prediction is determined in the model evaluation process (4).

3. The method (1) according to claim 1,
wherein the training-drive data sets are training-drive time series.

4. The method (1) according to claim 1,
wherein the load model is determined based on a generative model structure.

5. The method (1) according to claim 4,
wherein a recurrent conditional generative adversarial network is used as the model structure for the load model.

6. The method (1) according to claim 1,
wherein different training-drive data sets contain course of the route data and accompanying drive data which have been conducted under differing training conditions.

7. The method (1) according to claim 6,
wherein the different training conditions involve the training drives having been conducted using at least two different training vehicles and/or having been conducted on at least two different training routes and/or under at least two different environmental conditions.

8. The method (1) according to claim 1,
wherein the vehicle data contain a vehicle mass, a drag coefficient, and a tyre diameter of the training vehicle.

9. The method (1) according to claim 1, wherein the training vehicles are of a different vehicle type than the prediction vehicle.

10. The method (1) according to claim 1, wherein the load model is non-deterministic.

11. The method (1) according to claim 1, wherein determining the load prediction using the load model includes conducting more than 1000 simulations.

12. The method (1) according to claim 1, further comprising
designing the component of the vehicle based on the load prediction thereof.

* * * * *